United States Patent [19]

Keller

[11] Patent Number: 5,675,335

[45] Date of Patent: Oct. 7, 1997

[54] METHOD OF IMPROVING THE DISTORTION BEHAVIOR OF ANALOG-TO-DIGITAL CONVERTERS

[75] Inventor: Helmut Keller, Pfullingen, Germany

[73] Assignee: Wandel & Goltermann Elektronische Messtechnik GmbH, Horb, Germany

[21] Appl. No.: 528,948

[22] Filed: Sep. 15, 1995

[30] Foreign Application Priority Data

Apr. 13, 1995 [DE] Germany .................. 195 14 007.9

[51] Int. Cl.⁶ .................................................. H03M 1/06
[52] U.S. Cl. ........................ 341/131; 341/144; 341/155
[58] Field of Search ................................. 341/131, 144, 341/155

[56] References Cited

U.S. PATENT DOCUMENTS

| | | | |
|---|---|---|---|
| 3,999,129 | 12/1976 | Kasson | 325/42 |
| 4,187,466 | 2/1980 | Kasson et al. | 325/42 |
| 4,831,464 | 5/1989 | Chijiwa | 360/32 |
| 4,965,668 | 10/1990 | Abt et al. | 358/160 |
| 5,148,163 | 9/1992 | Frindle | 341/131 |
| 5,525,984 | 6/1996 | Bunker | 341/131 |
| 5,530,442 | 6/1996 | Norsworthy et al. | 341/131 |

*Primary Examiner*—Jeffrey A. Gaffin
*Assistant Examiner*—Jason L. W. Kost
*Attorney, Agent, or Firm*—Michael J. Striker

[57] ABSTRACT

In a method of improving a distortion ratio of an analog-to-digital converter, an analog signal to be digitized is additively superposed with a band-limited noise signal. The thusly produced sum signal is supplied to the analog-to-digital converter for sampling and quantization.

4 Claims, 1 Drawing Sheet

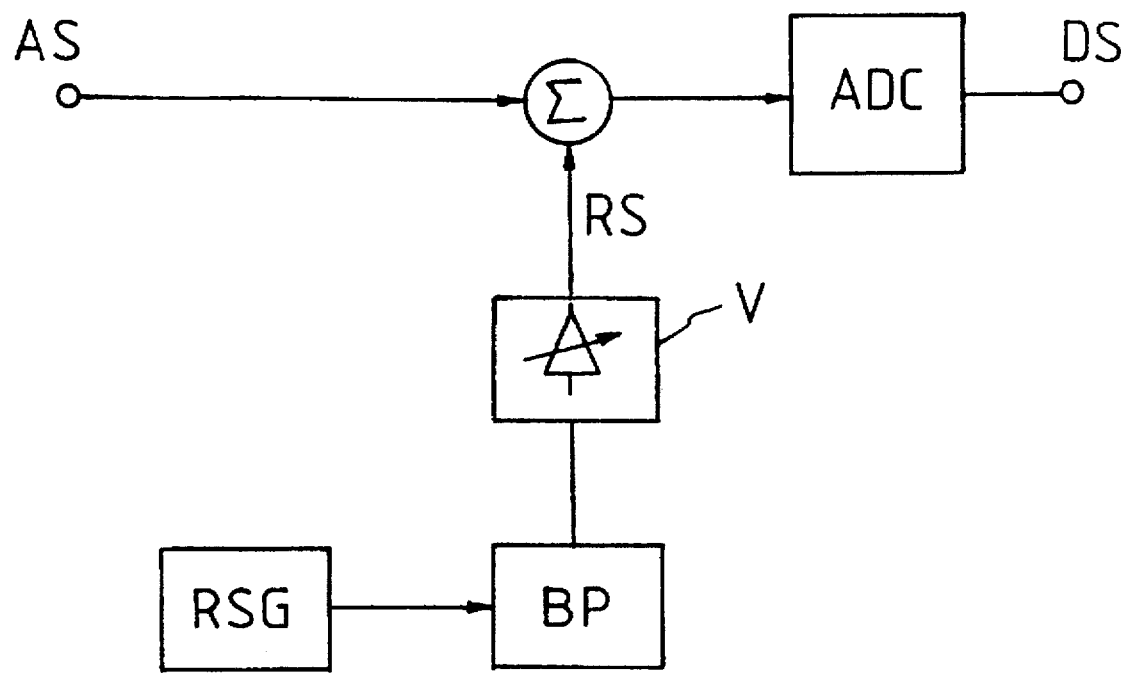

METHOD OF IMPROVING THE DISTORTION BEHAVIOR OF ANALOG-TO-DIGITAL CONVERTERS

BACKGROUND OF THE INVENTION

The present invention relates to a method of improving the distortion behavior of analog-to-digital converters.

More particularly, it relates to a method of improving the distortion behavior in accordance with which an analog information signal is additively superposed with a noise signal before supplying it to an analog-to-digital converter in which the sum signal including the information signal and the noise signal is sampled and digitized.

In this document, the term "distortion" is used mainly for harmonic distortion. Analog-digital converters in general generate a large number of harmonics, especially as they generate harmonics with very high order. These harmonics will be aliased into the frequency range below half of the sampling frequency. The harmonic relationship to the fundamental frequency is therefore often not obvious. These aliased harmonics of high order are often called spurious signals. Thus, the term "distortion" is used for this kind of distortion to.

The distortion behavior of analog-to-digital converters is clearly different from that which is conventional for analog components. The characteristic of an analog-to-digital converter can be described well as an irregular stepped curve. The level of the distortion products in first approximation independent from the control of the analog-to-digital converter, so that the distortion factors increase with reducing the level of the information signal. The level of the individual distortion products is located typically in the region of several decibels under the wide-band quantization noise level. With a real 12-bit converter the individual distortion products have a level of less than about 70 dBFS, wherein "dBFS" is a measure for the level, referred to the full scale level of the analog-to-digital converter. With analog components such as amplifiers or mixers, the distortion factors to the contrary decrease with reducing the level of the information signal, so that with sufficiently small levels very small distortion factors can be obtained.

In order to avoid the disadvantages of the quantization effect of analog-to-digital converters it is a current practice to utilize so-called "Dither" signals. These signals are additively superposed on the information signal and serve for modulating the converter, also during small information signal levels, of slightly more than 1 LSB (1 LSB is the height of a quantization stage). Most often white noise is utilized as the Dither signal. With this method also information signals with amplitudes under 1 LSB can be evaluated. The level of the Dither signal is maintained as low as possible so that the signal to noise ratio and the control range of the converter are not substantially worsened. A substantial improvement of the distortion behavior in the case of large information signals cannot be obtained through these current methods.

If it is necessary to improve the distortion behavior for larger information signals, the level of the Dither signal must be also selected high. This however is accompanied by disadvantages. A method of utilization of this approach is known. White noise produced by a digital random generator is utilized as a Dither signal. A very high quality DA converter (digital-to-analog converter) converts the digital noise signal into an analog signal. The analog noise signal is additively superimposed with the information signal. The level of the noise signal is so high that the control range for the information signal is substantially reduced (the sum of the Dither signal and the information signal must be located under the control limit of the AD converter). The wide-band, white Dither signal drastically worsens the signal to noise ratio. For eliminating this disadvantage, the digital noise signal is subtracted from the digitized sum signal by a digital subtractor. In order to perform this noise compensation well, a very high quality DA converter must be utilized. Moreover, the analog summing amplifier must operate in a very precise way. This method is very expensive and requires very high quality components.

SUMMARY OF THE INVENTION

Accordingly, it is an object of the present invention to provide a method of improving the distortion behavior of analog-to-digital converters, which avoids the disadvantages of the prior art.

In keeping with these objects and with others which will become apparent hereinafter, one feature of the present invention resides briefly stated, in a method of improving the distortion behavior of analog-to-digital converters, in accordance with which an analog information signal is superposed with a band-limited noise signal, and the frequency range of the noise signal is selected so that it is located outside of the information frequency range.

In this way the noise signal does not worsen the noise behavior of the AD converter in the information frequency range. The noise components outside of the information frequency range in many applications such as spectral analysis are of no importance. If a wide-band evaluation is necessary, these spectral components can be easily suppressed by a simple digital filter, and only several percentages of useable band width are lost. The level of the noise signal can be selected in this way so high as it is allowed by the control limit of the AD converter without worsening the noise behavior of the AD converter in the information frequency region. However, care should be taken that the sum of the information signal and the noise signal is located below the control limit of the AD converter. Short term overdrivings which occur relatively seldom and are not very strong do not worsen the distortion behavior and the noise behavior. Particularly when the information signal is smaller than the noise signal, the distortion behavior of the AD converter is improved dramatically. When the level of the noise signal is adjustable the distortion behavior and the control range for the information signal can be optimized for different applications.

It has been shown by experiments that the proposed new method is at least of the same quality as the above described and substantially more expensive method with respect to the distortion behavior. The noise behavior of the proposed method is in the practice better than the noise behavior of the known method since no noise compensation is needed.

For obtaining a great intermodulation free dynamic range in the IF stage of spectrum analyzers, it is advantageous to superpose additively on the information signal a large noise signal in the frequency range of half the sampling frequency. The RMS value of the noise signal can be greater than that of the information signal. It has been shown by experiments that with a resolution band width of 1 kHz an intermodulation free dynamic range of over 80 dB can be realized with an intermediate frequency of 19.2 MHz with fully digital intermediate frequency evaluation. The intermodulation free dynamic region with 1 Hz resolution band width can be located over 100 dB.

A further positive effect of the method in accordance with the present invention is that the level linearity of the analogto-digital converter becomes approximately ideal. This means that the accuracy of selective level measurement does not depend on the signal level.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

The FIGURE of the drawing is a view showing a block diagram illustrating a method of improving the distortion behavior of an analog-to-digital converter in accordance with the present invention.

DESCRIPTION OF THE PREFERRED EMBODIMENTS

In accordance with a method of improving the distortion behavior of an analog-to-digital converter, a sum signal composed of an analog information signal AS and a band-limited noise signal RS is supplied to an input of an analog-to-digital converter ADC. The noise signal is produced by a noise signal generator RSG and a subsequently arranged band pass filter BP. The level of the noise signal can be adjustable by an adjustable amplifier or attenuator V. A digitized signal DS is produced at the output of the analog-to-digital converter ADC.

The noise signal RS is limited to a frequency range which is located outside of an information frequency range. The level of the noise signal RS is preferably greater than the level of the information signal AS. However, it must be taken into consideration that the level of the sum signal composed of the information signal AS and the noise signal RS is located below the control limit of the analog-to-digital converter ADC.

The analog-to-digital converter ADC can be a 12 bit converter with a sampling frequency of approximately 25.6 MHz. With such a selected sampling frequency, the noise signal can have a center frequency of 12.8 MHz. The frequency band of the noise signal can be limited so that below 10 MHz and beyond 15.6 MHz the level of the noise signal is located at least 12 dB under the converter noise.

It will be understood that each of the elements described above, or two or more together, may also find a useful application in other types of methods differing from the types described above.

While the invention has been illustrated and described as embodied in a method of improving the distortion behavior of analog-to-digital converters, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of improving the distortion behavior of an analog-to-digital converter, comprising additively superposing an analog information signal with a noise signal to produce a sum signal; subsequently supplying the sum signal to an analog-to-digital converter so as to sample and digitize the sum signal; and band-limiting the noise signal to a frequency range located outside an information frequency range before said additively superposing the analog information signal with the noise signal, said limiting including selecting a RMS value of the noise signal substantially greater than a RMS value of a quantization noise of the analog-to-digital converter.

2. A method as defined in claim 1, wherein said limiting includes selecting a RMS value of the noise signal greater than that of the information signal.

3. A method as defined in claim 1, wherein said limiting includes selecting the band-limited noise signal in a frequency range which is located approximately in a region of half the sampling frequency of the analog-to-digital converter.

4. A method as defined in claim 1; and further comprising the step of changing the level of the noise signal by an adjustable amplifier or attenuator to fit different applications, with low noise levels resulting in high allowable information signals levels and high noise levels resulting in lower harmonic distortion.

* * * * *